United States Patent
Yoneda

(10) Patent No.: US 11,121,692 B2
(45) Date of Patent: Sep. 14, 2021

(54) NOISE FILTER CIRCUIT

(71) Applicant: MITSUBISHI ELECTRIC CORPORATION, Tokyo (JP)

(72) Inventor: Satoshi Yoneda, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/641,384

(22) PCT Filed: Sep. 12, 2017

(86) PCT No.: PCT/JP2017/032860
§ 371 (c)(1),
(2) Date: Feb. 24, 2020

(87) PCT Pub. No.: WO2019/053779
PCT Pub. Date: Mar. 21, 2019

(65) Prior Publication Data
US 2020/0195215 A1 Jun. 18, 2020

(51) Int. Cl.
| H03H 7/09 | (2006.01) |
| H03H 7/42 | (2006.01) |
| H03H 7/01 | (2006.01) |
| H05K 1/02 | (2006.01) |
| H05K 1/16 | (2006.01) |
| H03H 1/00 | (2006.01) |

(52) U.S. Cl.
CPC ............ *H03H 7/09* (2013.01); *H03H 1/0007* (2013.01); *H03H 7/0115* (2013.01); *H03H 7/425* (2013.01); *H05K 1/0216* (2013.01); *H05K 1/162* (2013.01); *H05K 1/165* (2013.01)

(58) Field of Classification Search
CPC ...... H03H 1/0007; H03H 7/427; H03H 7/425; H03H 7/09; H03H 7/17; H03H 7/0115
USPC ........................................ 333/175, 181, 185
See application file for complete search history.

(56) References Cited

U.S. PATENT DOCUMENTS

2015/0214915 A1* 7/2015 Yosui .................. H03H 7/1725
333/181
2017/0026019 A1* 1/2017 Sim ........................ H03H 7/427

FOREIGN PATENT DOCUMENTS

JP 5-190383 A 7/1993
JP 2013-77663 A 4/2013

* cited by examiner

*Primary Examiner* — Rakesh B Patel
(74) *Attorney, Agent, or Firm* — Birch, Stewart, Kolasch & Birch, LLP

(57) ABSTRACT

An input loop line (5) is disposed in a region inside or outside the loop of an output loop line (9) as viewed in the thickness direction of a dielectric layer (2).

9 Claims, 14 Drawing Sheets

NOISE FILTER CIRCUIT

TECHNICAL FIELD

The present invention relates to a noise filter circuit using a capacitor that connects lines to each other, or a line and ground. In particular, the present invention relates to a noise filter circuit having an ESL canceling structure for preventing deterioration of filter performance due to an equivalent series inductance (hereinafter, referred to as an ESL).

BACKGROUND ART

For example, the circuit module disclosed in Patent Literature 1 has an ESL canceling structure in which two loop-shaped conductive patterns face each other in the thickness direction of a dielectric layer.

The two loop-shaped conductive patterns are connected by a conductive via hole and magnetically coupled to generate a mutual inductance. The magnetically coupled two loop-shaped conductive patterns are described as coupling loops as required below.

In the above-described ESL canceling structure, the ESL is canceled by the mutual inductance generated between the coupling loops.

CITATION LIST

Patent Literatures

Patent Literature 1: JP 2013-77663 A

SUMMARY OF INVENTION

Technical Problem

The magnitude of the above-described mutual inductance is determined on the basis of the amount of magnetic flux, generated by the current flowing through one of the two loop-shaped conductive patterns, interlinking the other conductive pattern.

In the ESL canceling structure disclosed in Patent Literature 1, when interlayer misalignment occurs between the two loop-shaped conductive patterns, the area of the region where the two conductive patterns overlap as viewed in the thickness direction of a dielectric layer is reduced, and a mutual inductance greatly varies.

For this reason, when the interlayer misalignment occurs between the coupling loops due to, for example, a manufacturing error, the mutual inductance between the coupling loops greatly varies and the ESL cannot be canceled sufficiently in the noise filter circuit including the ESL canceling structure disclosed in Patent Literature 1.

In this case, there is a problem that the remaining ESL deteriorates filter performance.

The invention is made to solve the above-described problem, and an object thereof is to obtain a noise filter circuit that enables stable filter performance by suppressing the variation of a mutual inductance due to interlayer misalignment in the coupling loops.

Solution to Problem

A noise filter circuit according to the invention includes a dielectric layer and a capacitor.

The dielectric layer has one side on which an input line, an input loop line, a capacitor connection line, and an output line are formed, the input line, the input loop line, and the capacitor connection line being connected in series in this order.

The dielectric layer has another side on which an output loop line connected between the capacitor connection line and the output line and a ground conductor surrounding the output loop line are formed.

The capacitor has one end connected to the capacitor connection line and another end connected to the ground conductor.

In such a configuration, a winding direction of the input loop line from the input line to the capacitor connection line is same as a winding direction of the output loop line from the capacitor connection line to the output line.

The input loop line is disposed in a region inside or outside a loop of the output loop line as viewed in a thickness direction of the dielectric layer.

Advantageous Effects of Invention

According to the invention, an input loop line is disposed in a region inside or outside the loop of an output loop line as viewed in the thickness direction of a dielectric layer.

According to such a configuration, variation of the mutual inductance between the input loop line and the output loop line is suppressed even in a case where interlayer misalignment occurs between the input loop line and the output loop line, and stable filter performance can be achieved.

DESCRIPTION OF EMBODIMENTS

In order to describe the invention in more detail, some embodiments for carrying out the invention will be described below with reference to the accompanying drawings.

First Embodiment

Figure 1:
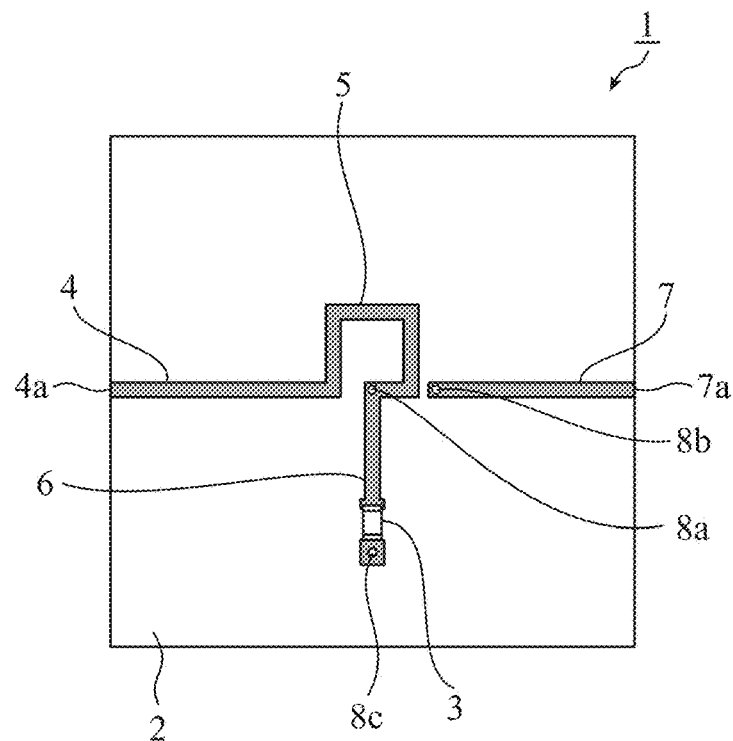
FIG. 1 is a plan view illustrating a noise filter circuit according to a first embodiment of the invention.
Figure 2:
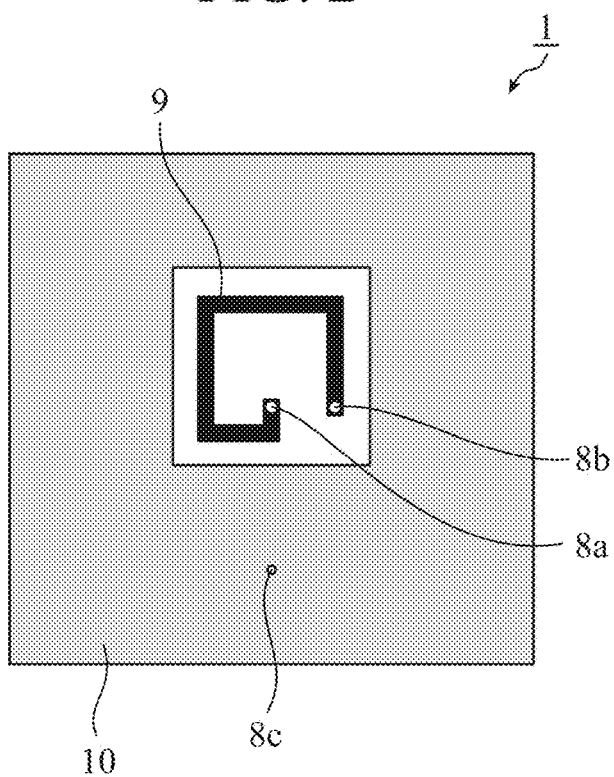
FIG. 2 is a transparent plan view illustrating a conductive pattern on the back side of the noise filter circuit according to the first embodiment.
Figure 3:
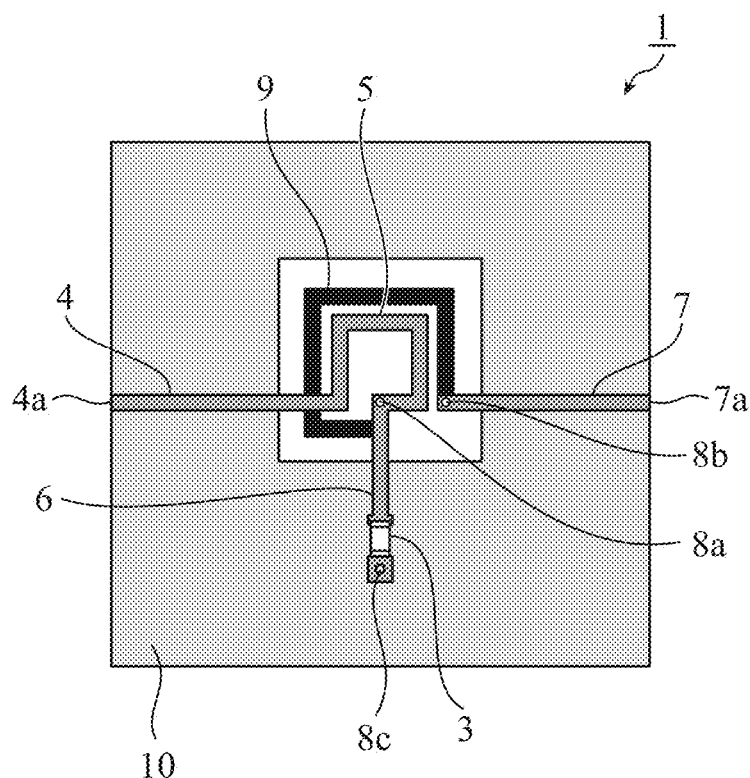
FIG. 3 is a transparent plan view illustrating the arrangement of the conductive pattern of the noise filter circuit according to the first embodiment.

FIG. 1 is a plan view illustrating a noise filter circuit 1 according to a first embodiment of the invention. FIG. 2 is a transparent plan view illustrating a conductive pattern on the back side of the noise filter circuit 1, with components of the noise filter circuit 1 up to the conductive pattern on the back side being made transparent. FIG. 3 is a transparent plan view illustrating the arrangement of the conductive pattern of the noise filter circuit 1 in which a dielectric layer 2 is made transparent.

The noise filter circuit 1 has a substrate including the dielectric layer 2 and the conductive patterns disposed on one side (hereinafter, referred to as the front surface) and the other side (hereinafter, referred to as the back surface) of the dielectric layer 2, and a chip capacitor 3 is mounted on the substrate.

An input line 4, an input loop line 5, a capacitor connection line 6, and an output line 7 are formed on the front surface of the dielectric layer 2 by a conductive pattern, and as illustrated in FIG. 1, the input line 4, the input loop line 5, and the capacitor connection line 6 are connected in series in this order.

Through holes 8a, 8b, and 8c are formed in the thickness direction of the dielectric layer 2, and electrically connect the conductive pattern on the front surface to the conductive pattern on the back surface of the dielectric layer 2.

As illustrated in FIGS. 2 and 3, an output loop line 9 and a ground conductor 10 are formed on the back surface of the dielectric layer 2 by a conductive pattern.

The capacitor 3 has one end connected to the capacitor connection line 6 and the other end electrically connected to the ground conductor 10 by the through hole 8c.

The input line 4 has one end serving as an input terminal 4a and the other end connected to the input loop line 5. The output line 7 has one end serving as an output terminal 7a.

The output loop line 9 has one end connected to the capacitor connection line 6 by the through hole 8a and the other end connected to the other end of the output line 7 by the through hole 8b. That is, the output loop line 9 is connected between the capacitor connection line 6 and the output line 7.

The ground conductor 10 is a solid pattern of a conductor provided so as to surround the output loop line 9 on the back surface of the dielectric layer 2.

In the noise filter circuit 1, the capacitor connection line 6 and the output loop line 9 are branched from the through hole 8a, and the capacitor connection line 6, the capacitor 3 connected to the capacitor connection line 6, and the through hole 8c constitute a shunt path.

Thus, the noise filter circuit 1 is a two-terminal circuit in which the capacitor 3 is in shunt connection between the line and the ground conductor 10 in the middle of the line.

The capacitor 3 in shunt connection between the line and the ground conductor 10 is generally known to function as a filter circuit for noise current flowing between the input terminal 4a and the output terminal 7a.

In addition, the winding direction of the input loop line 5 from the input line 4 to the capacitor connection line 6 is the same as that of the output loop line 9 from the capacitor connection line 6 to the output line 7.

Furthermore, each of the input loop line 5 and the output loop line 9 has a partially opened square loop shape, and the input loop line 5 has a loop outer diameter smaller than the loop inner diameter of the output loop line 9.

As illustrated in FIG. 3, the input loop line 5 is disposed in a region inside the loop of the output loop line 9 on the front surface of the dielectric layer 2 as viewed in the thickness direction of the dielectric layer 2.

Operation will now be described.

Figure 4:
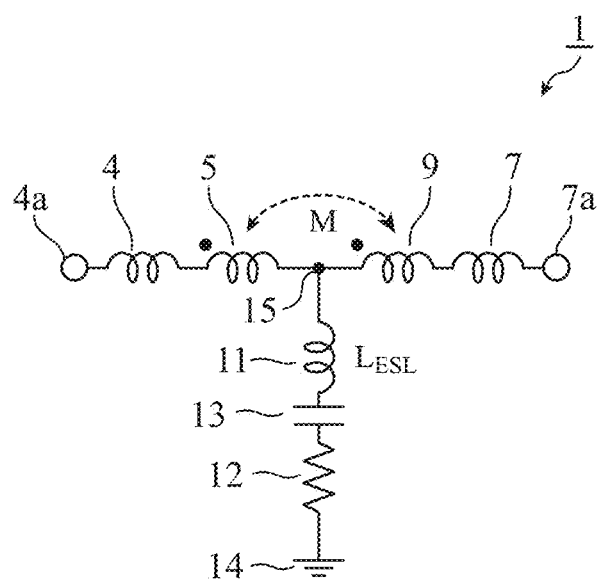
FIG. 4 is an equivalent circuit diagram illustrating the noise filter circuit according to the first embodiment.

FIG. 4 is an equivalent circuit diagram illustrating the noise filter circuit 1. In the noise filter circuit 1, the input loop line 5 and the output loop line 9 are magnetically coupled with each other. When the mutual inductance generated by the magnetic coupling is represented by M and the direction of the magnetic coupling between the input loop line 5 and the output loop line 9 is taken into consideration, the noise filter circuit 1 can be expressed by an equivalent circuit illustrated in FIG. 4.

In the equivalent circuit shown in FIG. 4, a shunt path between a ground 14 and a capacitor connection point 15 is represented by a series circuit including an ESL 11, an equivalent series resistance (hereinafter, referred to as an ESR) 12, and a capacitance 13. The ground 14 corresponds to the through hole 8c, and the capacitor connection point 15 corresponds to the through hole 8a. The ESL 11 has an inductance $L_{ESL}$.

Figure 5:
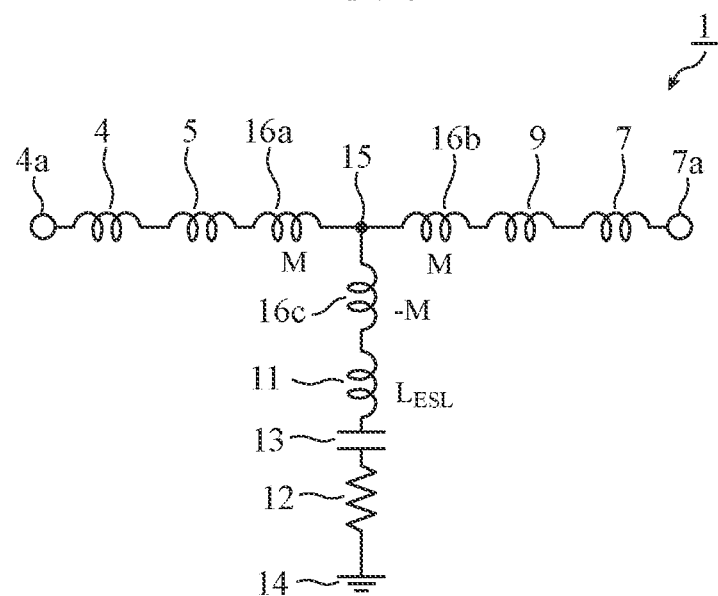
FIG. 5 is an equivalent circuit diagram illustrating the noise filter circuit, which is subjected to equivalent circuit conversion, according to the first embodiment.

FIG. 5 is an equivalent circuit diagram illustrating the noise filter circuit 1 that is subjected to equivalent circuit conversion. The circuit shown in FIG. 5 is obtained by performing equivalent circuit conversion on the part where the input loop line 5 and the output loop line 9 in FIG. 4 are magnetically coupled.

Equivalent inductors 16a, 16b, and 16c in FIG. 5 are added as a result of the equivalent circuit conversion. The equivalent inductor 16a has an inductance M, the equivalent inductor 16b has an inductance M, and the equivalent inductor 16c has an inductance −M.

In the circuit obtained by performing the equivalent circuit conversion on the part where the input loop line 5 and the output loop line 9 are magnetically coupled, the equivalent inductors 16a and 16b having mutual inductances M generated by the magnetic coupling are connected in series between the input loop line 5 and the output loop line 9. Furthermore, in this circuit, the equivalent inductor 16c having a negative mutual inductance −M is connected in series to the shunt path branched from the capacitor connection point 15. As a result, the shunt path between the ground 14 and the capacitor connection point 15 has an inductance of $L_{ESL}$−M.

In the noise filter circuit 1, the part where the input loop line 5 and the output loop line 9 are magnetically coupled is designed so that the inductance of the shunt path is 0, that is, $L_{ESL}$=M.

By designing the magnetically coupled part in this way, the inductance $L_{ESL}$, which is originally held by the shunt path between the ground 14 and the capacitor connection point 15, can be canceled and set to almost zero. As a result, deterioration of filter performance due to the influence of the ESL 11 can be suppressed.

Next, variation of mutual inductance between coupling loops in a case where an interlayer misalignment occurs will be described.

Figure 6:
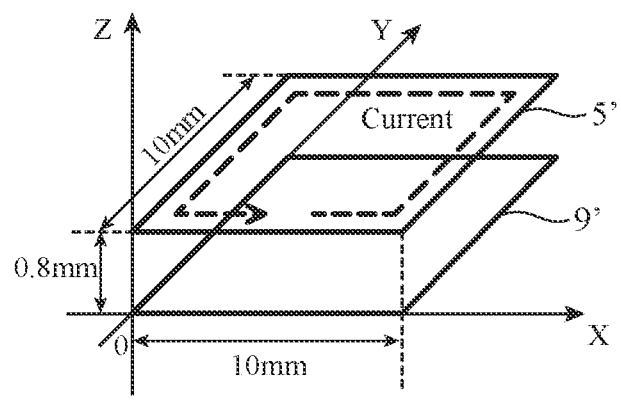
FIG. 6 is a partial perspective view illustrating coupling loops in a conventional ESL canceling structure.

FIG. 6 is a partial perspective view illustrating coupling loops in a conventional ESL canceling structure.

As illustrated in FIG. 6, each of an input loop line 5' and an output loop line 9' in the conventional ESL canceling structure has a square loop shape with the side of 10 mm.

The input loop line 5' and the output loop line 9' are magnetically coupled with each other being spaced 0.8 mm apart in the thickness direction (Z-axis direction) of a dielectric layer.

The input loop line 5' and the output loop line 9' are formed by an ideal line element (lossless line).

The input loop line 5' is disposed on a plane of Z=0.8 mm, and the output loop line 9' is disposed on a plane of Z=0.

The mutual inductance M between the input loop line 5' and the output loop line 9' can be calculated from the amount of magnetic flux vertically penetrating the plane formed by the loop of die output loop line 9' among the magnetic flux generated by the current flowing through the input loop line 5'.

When there is no interlayer misalignment between the input loop line 5' and the output loop line 9', the mutual inductance M is 14.7 nH.

Figure 7:
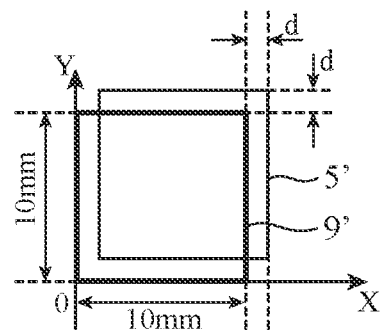
FIG. 7 is a partial plan view illustrating an example of interlayer misalignment between an input loop line and an output loop line in the conventional ESL canceling structure.

FIG. 7 is a partial plan view illustrating interlayer misalignment between the input loop line 5' and the output loop line 9' in the conventional ESL canceling structure, and illustrates the input loop line 5' in FIG. 6 shifted by d in each of the X-axis direction and the Y-axis direction due to the interlayer misalignment.

Figure 8:
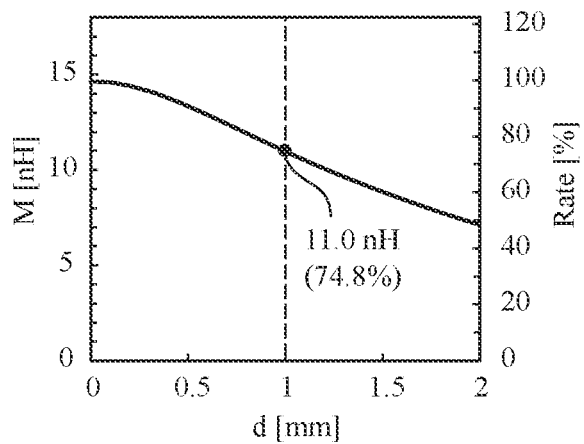
FIG. 8 is a graph illustrating the relationship between the amount of interlayer misalignment between the input loop line and the output loop line and a calculation result of the mutual inductance in the conventional ESL canceling structure.

FIG. 8 is a graph illustrating the relationship between die amount of interlayer misalignment between the input loop line 5' and the output loop line 9' and a calculation result of the mutual inductance M in the conventional ESL canceling structure.

The mutual inductance M is reduced by the interlayer misalignment. When d in FIG. 7 is assumed to 1.0 mm, the mutual inductance M is 11.0 nH as illustrated in FIG. 8, and is reduced to approximately 75% of that in a case where there is no interlayer misalignment.

Figure 9:
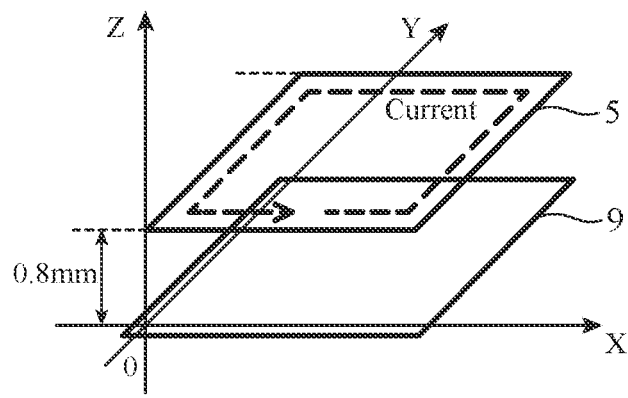
FIG. 9 is a partial perspective view illustrating coupling loops in the noise filter circuit according to the first embodiment.
Figure 10:
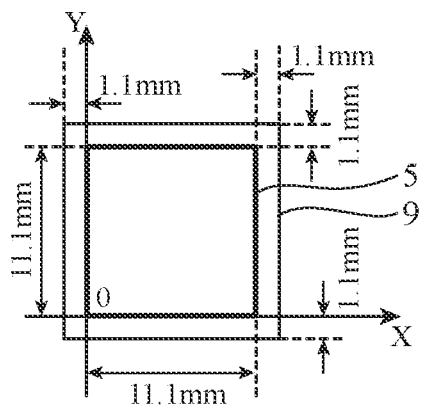
FIG. 10 is a partial plan view illustrating the coupling loops in the noise filter circuit according to the first embodiment.

FIG. 9 is a partial perspective view illustrating an example of coupling loops in the noise filter circuit 1 according to the first embodiment. FIG. 10 is a partial plan view illustrating an example of the coupling loops in the noise filter circuit 1. Each of the input loop line 5 and the output loop line 9 is formed by an ideal line element (lossless line). As illustrated in FIG. 9, the input loop line 5 is disposed on the plane of Z=0.8 mm, and the output loop line 9 is disposed on die plane of Z=0.

As illustrated in FIG. 10, the input loop line 5 has a square loop shape with the side of 11.1 mm, and the output loop line 9 has a square loop shape with the side of 13.3 mm.

In addition, the output loop line 9 has a loop shape obtained by extending the input loop line 5 by 1.1 mm in each of the positive and negative directions in the X-axis and Y-axis directions as viewed in the thickness direction (Z-axis direction) of the dielectric layer 2.

Furthermore, the XY coordinate position of the center of the input loop line 5 coincides with that of the center of the output loop line 9. That is, the input loop line 5 is disposed in a region inside the loop of the output loop line 9 on the front surface of the dielectric layer 2 as viewed in the Z-axis direction.

The mutual inductance M between the input loop line 5 and the output loop line 9 can be calculated from the amount of magnetic flux vertically penetrating the plane formed by the loop of the output loop line 9 among the magnetic flux generated by the current flowing through the input loop line 5.

When there is no interlayer misalignment between the input loop line 5 and the output loop line 9, the mutual inductance M is 14.7 nH.

Figure 11:
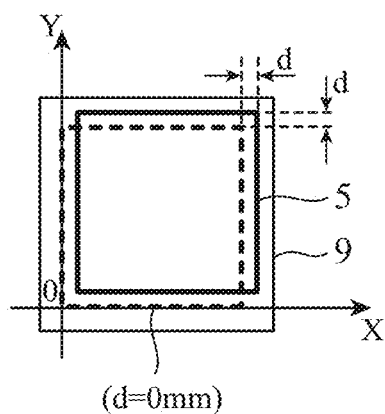
FIG. 11 is a partial plan view illustrating an example of interlayer misalignment between an input loop line and an output loop line in the noise filter circuit according to the first embodiment.

FIG. 11 is a partial plan view illustrating interlayer misalignment between the input loop line 5 and the output loop line 9 in the noise filter circuit 1, and illustrates a case where the input loop line 5 in FIG. 10 is shifted by d in each of the X-axis direction and the Y-axis direction due to the interlayer misalignment.

Figure 12:
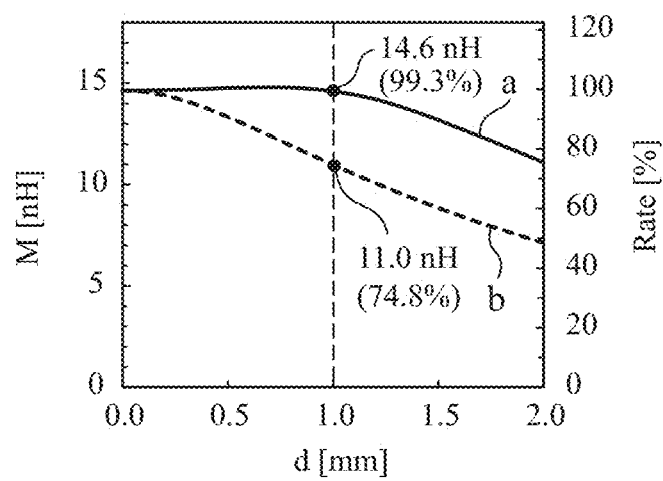
FIG. 12 is a graph illustrating the relationship between the amount of interlayer misalignment between the input loop line and the output loop line and a calculation result of the mutual inductance in the noise filter circuit according to the first embodiment.

FIG. 12 is a graph illustrating the relationship between the amount of interlayer misalignment between the input loop line 5 and the output loop line 9 and a calculation result a of the mutual inductance M in the noise filter circuit 1.

The calculation result a of the mutual inductance M represented by a solid line in FIG. 12 indicates a case where the interlayer misalignment in FIG. 11 occurs in the input loop line 5.

For comparison, a calculation result b of the mutual inductance M in the conventional structure in FIG. 8 is represented by a broken line.

As described above, when d in FIG. 7 is 1.0 mm, a calculation result b of the mutual inductance M in coupling loops of the conventional structure is 11.0 nH, and is reduced to approximately 75% of that in a case where there is no interlayer misalignment.

In contrast, in the noise filter circuit 1, even in the case where d in FIG. 11 is 1.0 mm, the calculation result a of the mutual inductance M between the input loop line 5 and the output loop line 9 is 14.6 nH, and the value of approximately 99.3% of that in a case where there is no interlayer misalignment is maintained.

It can thus be found that the coupling loops in the noise filter circuit 1 can suppress variation of the mutual inductance M due to interlayer misalignment comparing with the coupling loops in the conventional structure.

That is, in the noise filter circuit 1, even in a case where interlayer misalignment occurs in the coupling loops, the area of the region where the input loop line 5 and the output loop line 9 overlap as viewed in the thickness direction of the dielectric layer 2 is less likely to be reduced, and reduction of the mutual inductance M is suppressed. As a result, stable filter performance can be achieved.

Note that, although the case where each of the input loop line 5 and the output loop line 9 has a partially opened square loop shape is illustrated, no limitation is intended by this example.

It is only required for the noise filter circuit to have a configuration such that the input loop line 5 has a loop outer diameter smaller than the loop inner diameter of the output loop line 9, and has a loop shape so as to be disposed in a region inside the loop of the output loop line 9 on the front surface of the dielectric layer 2 as viewed in the thickness direction of the dielectric layer 2.

For example, the loop shape may be a partially opened circular shape.

Although the case where the input loop line 5 is disposed in a region inside the loop of the output loop line 9 as viewed in the thickness direction of the dielectric layer 2 is described above, no limitation is intended by this example for the first embodiment. For example, the input loop line 5 may be disposed in a region outside the loop of the output loop line 9 as viewed in the thickness direction of the dielectric layer 2 by forming the loop inner diameter of the input loop line 5 to be larger than the loop outer diameter of the output loop line 9.

Such configuration can also suppress the reduction of the mutual inductance M due to the interlayer misalignment in the coupling loops.

As described above, in the noise filter circuit 1 according to the first embodiment, the input loop line 5 is disposed in a region inside or outside the loop of the output loop line 9 as viewed in the thickness direction of the dielectric layer 2. Each of the input loop line 5 and the output loop line 9 has a partially opened rectangular loop shape or a partially opened circular loop shape.

Such configuration suppresses variation of the mutual inductance M even in a case where interlayer misalignment occurs between the input loop line 5 and the output loop line 9, and enables stable filter performance.

Second Embodiment

Figure 13:
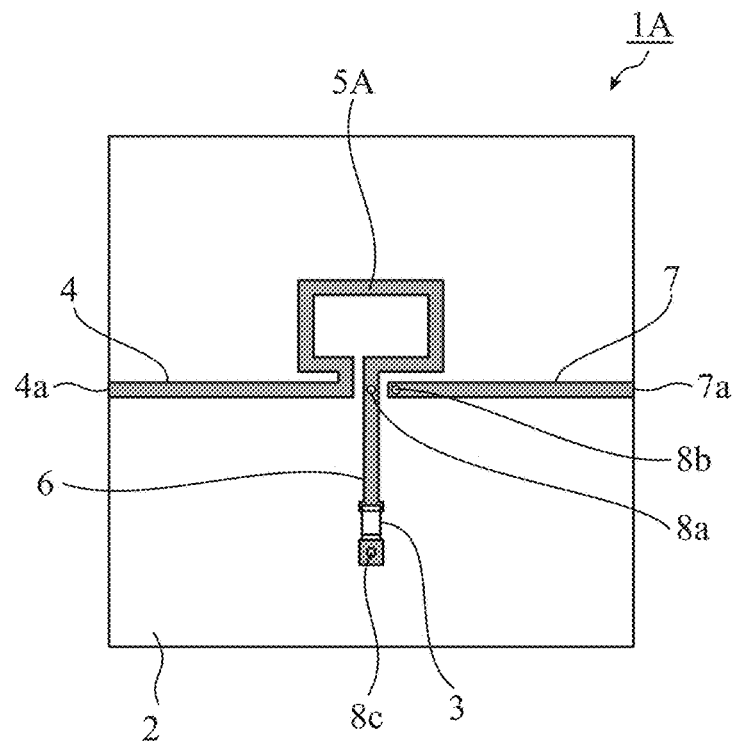
FIG. 13 is a plan view illustrating a noise filter circuit according to a second embodiment of the invention.
Figure 14:
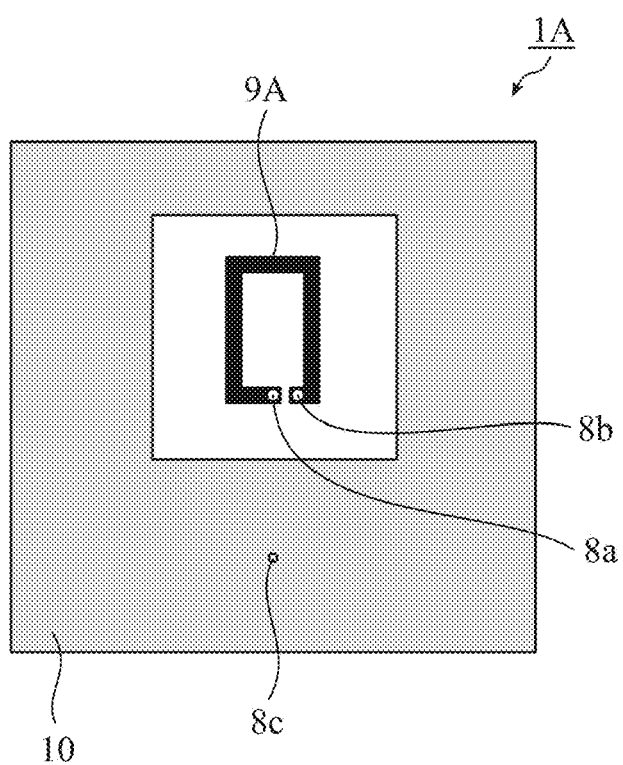
FIG. 14 is a transparent plan view illustrating a conductive pattern on the back side of the noise filter circuit according to the second embodiment.
Figure 15:
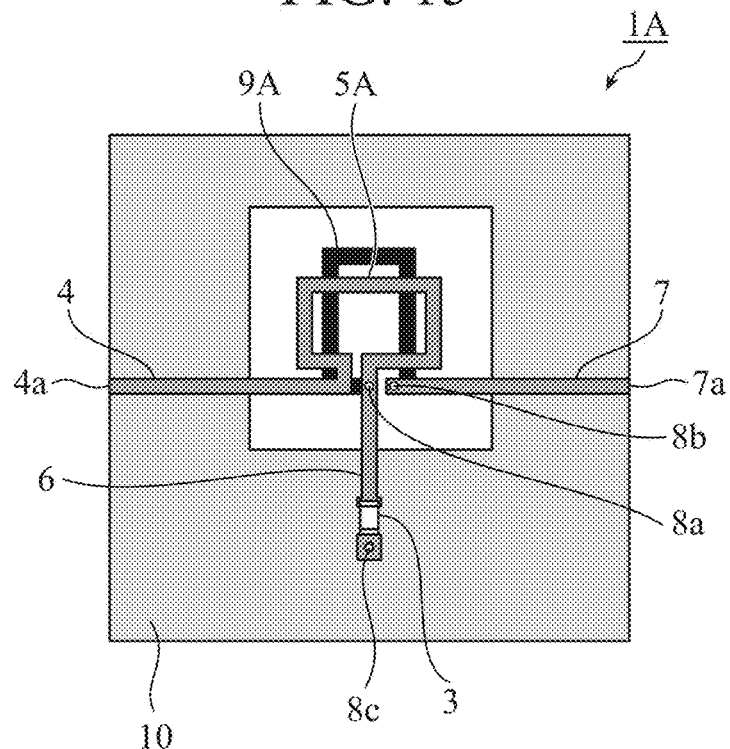
FIG. 15 is a transparent plan view illustrating the arrangement of the conductive pattern of the noise filter circuit according to the second embodiment.

FIG. 13 is a plan view illustrating a noise filter circuit 1A according to a second embodiment of the invention. FIG. 14 is a transparent plan view illustrating a conductive pattern of the noise filter circuit 1A on the back side, with components of the noise filter circuit 1A up to the conductive pattern on the back side being made transparent. FIG. 15 is a transparent plan view illustrating the arrangement of the conductive pattern of the noise filter circuit 1A in which with a dielectric layer 2 is made transparent.

The noise filter circuit 1A has a substrate including the dielectric layer 2 and conductive patterns disposed on the front surface and back surface of the dielectric layer 2, and a chip capacitor 3 is mounted on the substrate.

An input line 4, an input loop line 5A, a capacitor connection line 6, and an output line 7 are formed on the front surface of the dielectric layer 2 by a conductive pattern, and as illustrated in FIG. 13, the input line 4, the input loop line 5A, and the capacitor connection line 6 are connected in series in this order.

Through holes 8a, 8b, and 8c are formed in the thickness direction of the dielectric layer 2, and electrically connect the conductive pattern on the front surface to the conductive pattern on the back surface of the dielectric layer 2.

As illustrated in FIGS. 14 and 15, an output loop line 9A and a ground conductor 10 are formed on the back surface of the dielectric layer 2 by a conductive pattern.

As illustrated in FIG. 13, the input loop line 5A has a partially opened rectangular loop shape, and as illustrated in FIG. 14, the output loop line 9A has a partially opened rectangular loop shape.

As illustrated in FIG. 15, the input loop line 5A and the output loop line 9A are disposed in such a manner that the long sides of the loop shape of the input loop line 5A and the long sides of the loop shape of the output loop line 9A are orthogonal to each other as viewed in the thickness direction of the dielectric layer 2.

Note that, in FIGS. 13 to 15, the same signs are attached to the same components as those in FIGS. 1 to 3, and description thereof will be omitted. The equivalent circuit of the noise filter circuit 1A is the same as the circuits shown in FIGS. 4 and 5.

Variation of mutual inductance between coupling loops in a case where an interlayer misalignment occurs will now be described.

Figure 16:
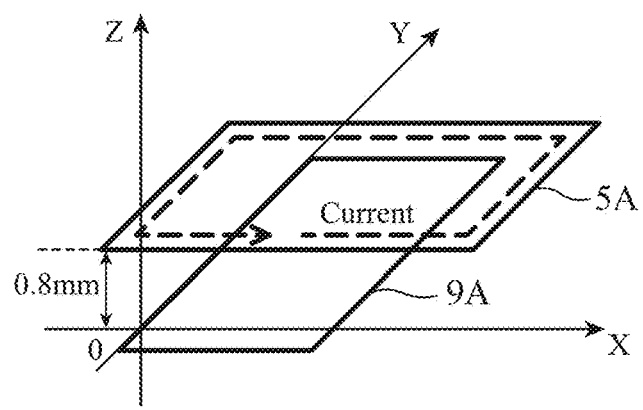
FIG. 16 is a partial perspective view illustrating an example of coupling loops in the noise filter circuit according to the second embodiment.
Figure 17:
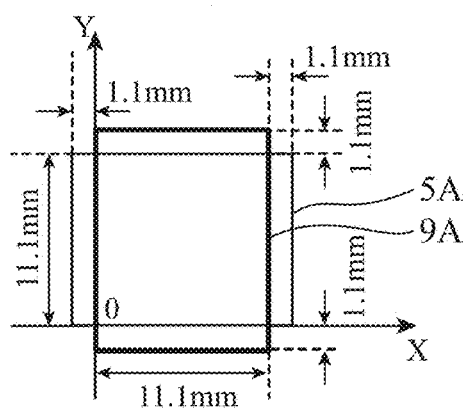
FIG. 17 is a partial plan view illustrating an example of the coupling loops in the noise filter circuit according to the second embodiment.

FIG. 16 is a partial perspective view illustrating an example of coupling loops in the noise filter circuit 1A according to the second embodiment. FIG. 17 is a partial plan view illustrating an example of coupling loops in the noise filter circuit 1A. The input loop line 5A and the output loop line 9A are formed by an ideal line element (lossless line). As illustrated in FIG. 16, the input loop line 5A is disposed on a plane of Z=0.8 mm, and the output loop line 9A is disposed on a plane of Z=0.

As illustrated in FIG. 17, the input loop line 5A has a rectangular loop shape with a long side of 13.3 mm and a short side of 11.1 mm, and the output loop line 9A has a rectangular loop shape with a long side of 13.3 mm and a short side of 11.1 mm.

As viewed in the thickness direction (Z-axis direction) of the dielectric layer 2, the long sides of the input loop line 5A are parallel to the X-axis direction, and the long sides of the output loop line 9A are parallel to the Y-axis direction.

The XY coordinate position of the center of the input loop line 5A coincides with that of the center of the output loop line 9A. That is, the input loop line 5A is arranged to be a state obtained by rotating the output loop line 9A by 90 degrees on the front surface of the dielectric layer 2 as viewed in the Z-axis direction.

The mutual inductance M between the input loop line 5A and the output loop line 9A can be calculated from the amount of magnetic flux vertically penetrating the plane formed by the loop of the output loop line 9A among the magnetic flux which is generated by the current flowing through the input loop line 5A.

When there is no interlayer misalignment between the input loop line 5A and the output loop line 9A, the mutual inductance M is 14.7 nH.

Figure 18:
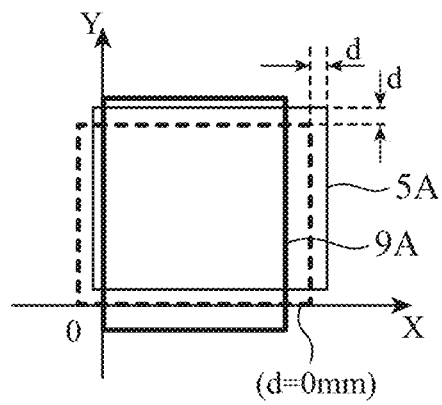
FIG. 18 is a partial plan view illustrating an example of interlayer misalignment between an input loop line and an output loop line in the noise filter circuit according to the second embodiment.

FIG. 18 is a partial plan view illustrating an example of interlayer misalignment between the input loop line 5A and the output loop line 9A in the noise filter circuit 1A, and illustrates the input loop line 5A, in FIG. 17, which is shifted by d in each of the X-axis direction and the Y-axis direction due to the interlayer misalignment.

Figure 19:
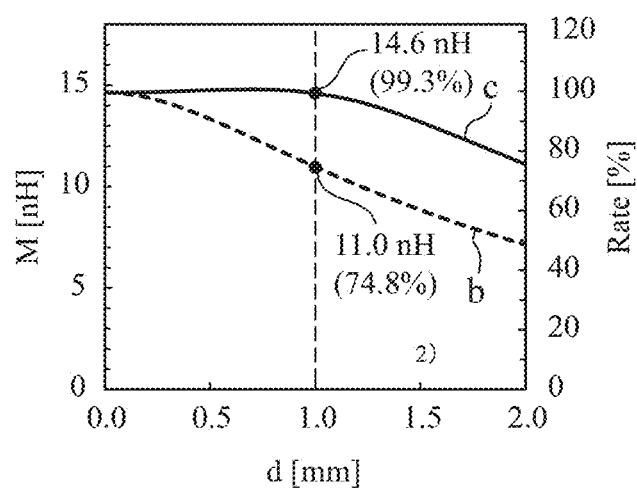
FIG. 19 is a graph illustrating the relationship between the amount of interlayer misalignment between the input loop line and the output loop line and a calculation result of the mutual inductance in the noise filter circuit according to the second embodiment.

FIG. 19 is a graph illustrating the relationship between the amount of interlayer misalignment between the input loop line 5A and the output loop line 9A and a calculation result c of the mutual inductance M in the noise filter circuit 1A.

The calculation result c of the mutual inductance M indicated by a solid line in FIG. 19 indicates a case where the interlayer misalignment in FIG. 18 occurs in the input loop line 5A.

For comparison, a calculation result b of the mutual inductance M in the conventional structure in FIG. 8 is indicated by a broken line.

As described before, when d in FIG. 7 is 1.0 mm, a calculation result b of the mutual inductance M in coupling loops of the conventional structure is 11.0 nH, and is reduced to approximately 75% of that in a case where there is no interlayer misalignment.

In contrast, in the noise filter circuit 1A, even though d in FIG. 18 is 1.0 mm, the calculation result c of the mutual inductance M between the input loop line 5A and the output loop line 9A is 14.6 nH, and the value of approximately 99.3% of that in a case where there is no interlayer misalignment is maintained.

It can thus be found that the coupling loops in the noise filter circuit 1A can suppress variation of the mutual inductance M due to interlayer misalignment comparing with the coupling loops in the conventional structure.

That is, in the noise filter circuit 1A, even in a case where interlayer misalignment occurs in the coupling loops, the area of the region where the input loop line 5A and the output loop line 9A overlap as viewed in the thickness direction of the dielectric layer 2 is less likely to be reduced, and reduction of the mutual inductance M is suppressed. As a result, stable filter performance can be achieved.

As described above, in the noise filter circuit 1A according to the second embodiment, the input loop line 5A and the output loop line 9A are disposed in such a manner that the long sides of the loop shape of the input loop line 5A and the long sides of the loop shape of the output loop line 9A are orthogonal to each other as viewed in the thickness direction of the dielectric layer 2. According to such a configuration, variation of the mutual inductance M is suppressed even in a case where interlayer misalignment occurs between the input loop line 5A and the output loop line 9A, and stable filter performance can be achieved.

Third Embodiment

Figure 20:
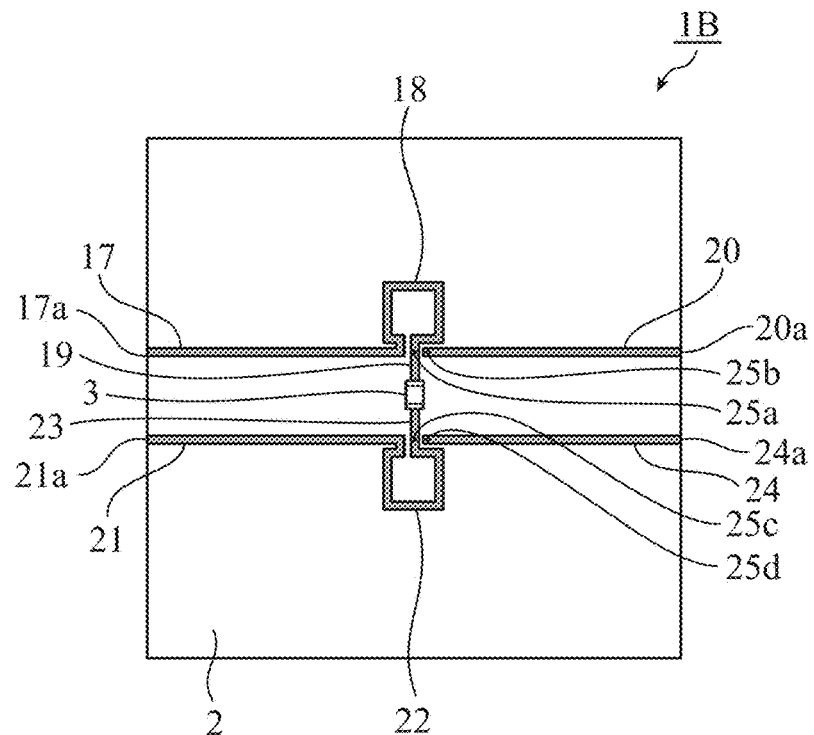
FIG. 20 is a plan view illustrating a noise filter circuit according to a third embodiment of the invention.
Figure 21:
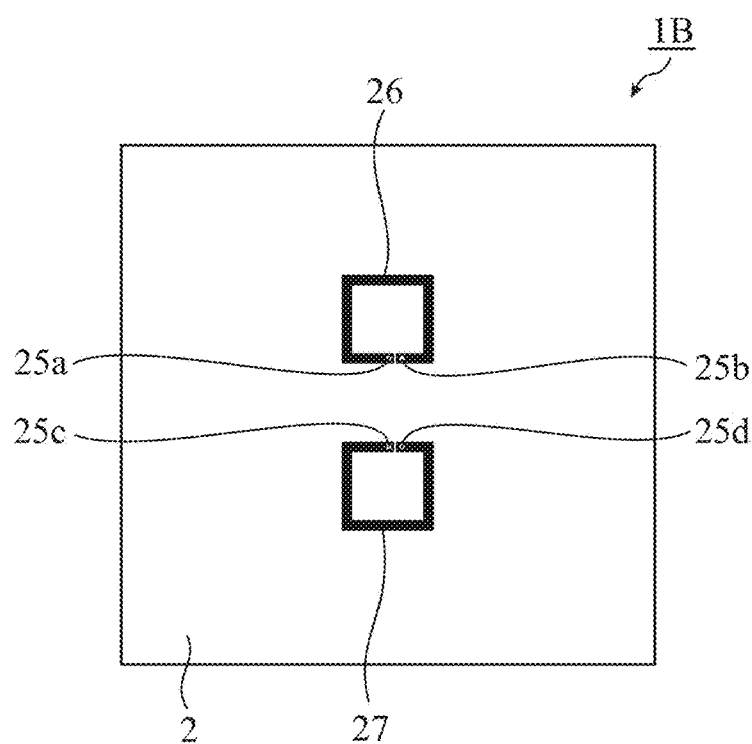
FIG. 21 is a transparent plan view illustrating a conductive pattern on the back side of the noise filter circuit according to the third embodiment.
Figure 22:
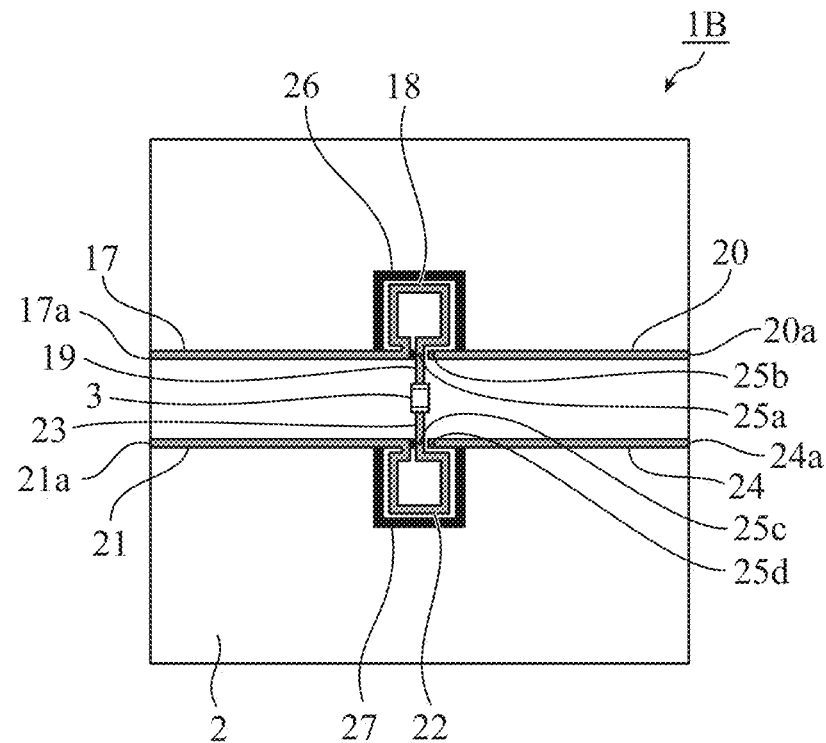
FIG. 22 is a transparent plan view illustrating the arrangement of the conductor pattern of the noise filter circuit according to the third embodiment.

FIG. 20 is a plan view illustrating a noise filter circuit 1B according to a third embodiment of the invention. FIG. 21 is a transparent plan view illustrating the conductive pattern on the back side of the noise filter circuit 1B, with components of the noise filter circuit 1B up to the conductive pattern on the back side being made transparent. FIG. 22 is a transparent plan view illustrating the arrangement of the conductive pattern of the noise filter circuit 1B in which a dielectric layer 2 is made transparent.

The noise filter circuit 1B has a substrate including the dielectric layer 2 and the conductive patterns disposed on the front surface and back surface of the dielectric layer 2, and a chip capacitor 3 is mounted on the substrate.

A positive-electrode-side input line 17, a positive-electrode-side input loop line 18, a positive-electrode-side capacitor connection line 19, and a positive-electrode-side output line 20 are formed on the front surface of the dielectric layer 2 by a conductive pattern.

A negative-electrode-side input line 21, a negative-electrode-side input loop line 22, a negative-electrode-side capacitor connection line 23, and a negative-electrode-side output line 24 are formed on the front surface of the dielectric layer 2 by a conductive pattern.

As illustrated in FIG. 20, the positive-electrode-side input line 17, the positive-electrode-side input loop line 18, and the positive-electrode-side capacitor connection line 19 are connected in series in this order, and the negative-electrode-side input line 21, the negative-electrode-side input loop line 22, and the negative-electrode-side capacitor connection line 23 are connected in series in this order.

Through holes 25a, 25b, 25c, and 25d are formed in the thickness direction of the dielectric layer 2, and electrically connect the conductive pattern on the front surface to the conductive pattern on the back surface of the dielectric layer 2.

As illustrated in FIGS. 21 and 22, a positive-electrode-side output loop line 26 and a negative-electrode-side output loop line 27 are formed on the back surface of the dielectric layer 2 by conductive patterns.

The positive-electrode-side input line 17 has one end serving as a positive-electrode-side input terminal 17a and the other end connected to the positive-electrode-side input loop line 18. The positive-electrode-side output line 20 has one end serving as a positive-electrode-side output terminal 20a.

The negative-electrode-side input line 21 has one end serving as a negative-electrode-side input terminal 21a and the other end connected to the negative-electrode-side input loop line 22. The negative-electrode-side output line 24 has one end serving as a negative-electrode-side output terminal 24a.

The positive-electrode-side output loop line 26 has one end connected to the positive-electrode-side capacitor connection line 19 by the through hole 25a and the other end connected to the other end of the positive-electrode-side output line 20 by the through hole 25b. That is, the positive-electrode-side output loop line 26 is connected between the positive-electrode-side capacitor connection line 19 and the positive-electrode-side output line 20.

Similarly, the negative-electrode-side output loop line 27 has one end connected to the negative-electrode-side capacitor connection line 23 by the through hole 25c and the other end connected to the other end of the negative-electrode-side output line 24 by the through hole 25d. That is, the negative-electrode-side output loop line 27 is connected between the negative-electrode-side capacitor connection line 23 and the negative-electrode-side output line 24.

In the noise filter circuit 1B, the path obtained by connecting the positive-electrode-side input line 17, the positive-electrode-side input loop line 18, the through hole 25a, the positive-electrode-side output loop line 26, the through hole 25b, and the positive-electrode-side output line 20 in this order is a positive-electrode-side path.

Similarly, the path obtained by connecting the negative-electrode-side input line 21, the negative-electrode-side input loop line 22, the through hole 25c, the negative-electrode-side output loop line 27, the through hole 25d, and the negative-electrode-side output line 24 in this order is a negative-electrode-side path.

The capacitor 3 has one end connected to the positive-electrode-side capacitor connection line 19 and the other end connected to the negative-electrode-side capacitor connection line 23.

The noise filter circuit 1B is a four-terminal circuit in which the capacitor 3 is connected to a shunt path between the positive-electrode-side path and the negative-electrode-side path.

The capacitor 3 connected between the positive-electrode-side path and the negative-electrode-side path is generally known to function as a so-called filter circuit against normal mode noise (high frequency noise) in which signals in reverse phases are input to the positive-electrode-side input terminal 17a and the negative-electrode-side input terminal 21a.

The winding direction of the positive-electrode-side input loop line 18 from the positive-electrode-side input line 17 to the positive-electrode-side capacitor connection line 19 is the same as that of the positive-electrode-side output loop line 26 from the positive-electrode-side capacitor connection line 19 to the positive-electrode-side output line 20.

The winding direction of the negative-electrode-side input loop line 22 from the negative-electrode-side input line 21 to the negative-electrode-side capacitor connection line 23 is the same as that of the negative-electrode-side output loop line 27 from the negative-electrode-side capacitor connection line 23 to the negative-electrode-side output line 24.

Each of the positive-electrode-side input loop line 18 and the positive-electrode-side output loop line 26 has a partially opened square loop shape, and the positive-electrode-side input loop line 18 has a loop outer diameter smaller than the loop inner diameter of the positive-electrode-side output loop line 26.

Furthermore, as illustrated in FIG. 22, the positive-electrode-side input loop line 18 is disposed in a region inside the loop of the positive-electrode-side output loop line 26 on the front surface of the dielectric layer 2 as viewed in the thickness direction of the dielectric layer 2.

Similarly, each of the negative-electrode-side input loop line 22 and the negative-electrode-side output loop line 27 has a partially opened square loop shape, and the negative-electrode-side input loop line 22 has a loop outer diameter smaller than the loop inner diameter of the negative-electrode-side output loop line 27.

The negative-electrode-side input loop line 22 has the same loop inner diameter as that of the positive-electrode-side input loop line 18, and the negative-electrode-side output loop line 27 has the same loop outer diameter as that of the positive-electrode-side output loop line 26.

As illustrated in FIG. 22, the negative-electrode-side input loop line 22 is disposed in a region inside the loop of the negative-electrode-side output loop line 27 on the front surface of the dielectric layer 2 as viewed in the thickness direction of the dielectric layer 2.

Operation will now be described.

Figure 23:
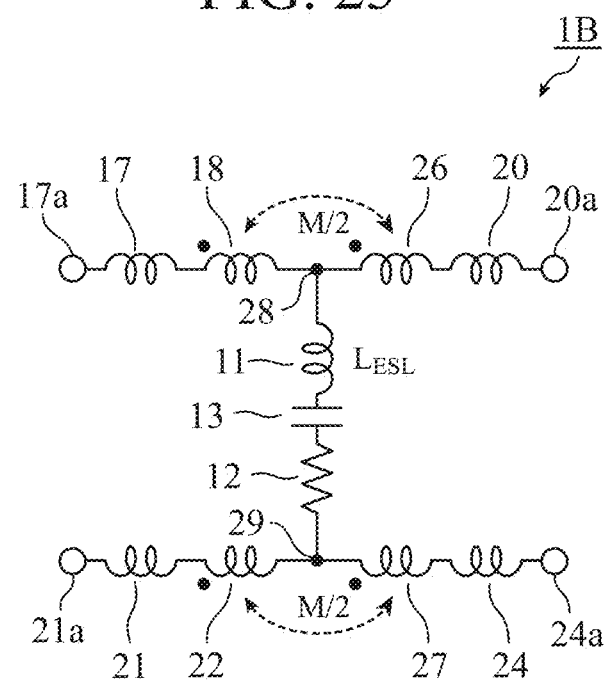
FIG. 23 is an equivalent circuit diagram illustrating the noise filter circuit according to the third embodiment.

FIG. 23 is an equivalent circuit diagram illustrating the noise filter circuit 1B. In the noise filter circuit 1B, the positive-electrode-side input loop line 18 and the positive-electrode-side output loop line 26 are magnetically coupled, and the negative-electrode-side input loop line 22 and the negative-electrode-side output loop line 27 are magnetically coupled. When each of the mutual inductances generated by the magnetic coupling is represented by M/2 and the direction of the magnetic coupling between these coupling loops is taken into consideration, the noise filter circuit 1B can be expressed by an equivalent circuit shown in FIG. 23.

In the equivalent circuit shown in FIG. 23, a shunt path between a positive-electrode-side capacitor connection point 28 and a negative-electrode-side capacitor connection point 29 can be represented by a series circuit including an ESL 11, an ESR 12, and a capacitance 13.

The positive-electrode-side capacitor connection point 28 corresponds to a position where the through hole 25a is disposed, and the negative-electrode-side capacitor connection point 29 corresponds to a position where the through hole 25c is disposed.

The ESL 11 has an inductance $L_{ESL}$.

Figure 24:
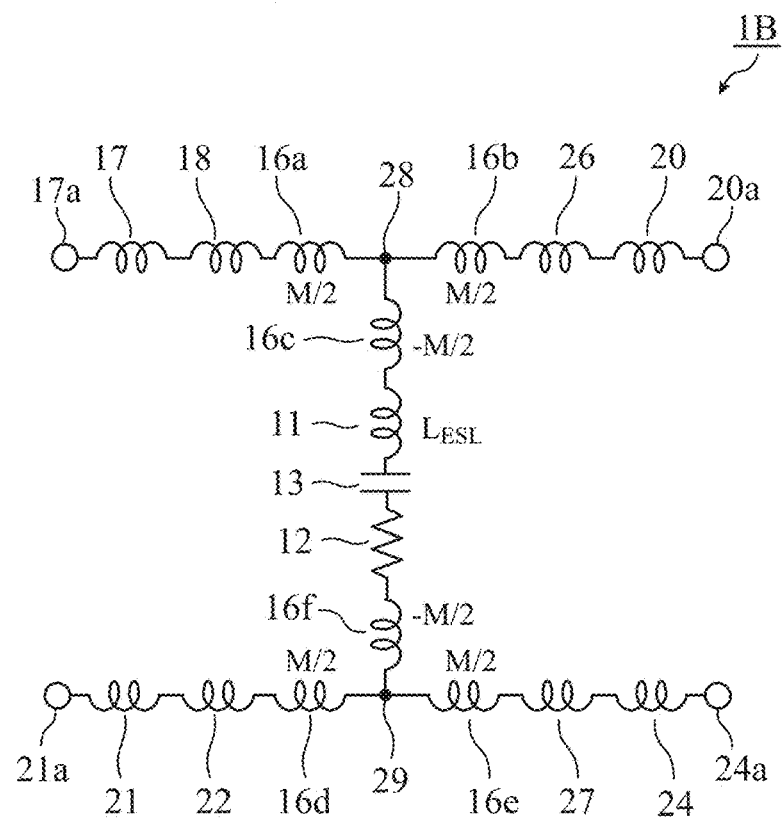
FIG. 24 is an equivalent circuit diagram illustrating the noise filter circuit which is subjected to equivalent circuit conversion according to the third embodiment.

FIG. 24 is an equivalent circuit diagram illustrating the noise filter circuit 1B that is subjected to equivalent circuit conversion.

The circuit shown in FIG. 24 is obtained by performing equivalent circuit conversion on a part where the positive-electrode-side input loop line 18 and the positive-electrode-side output loop line 26 in FIG. 23 are magnetically coupled and further performing equivalent circuit conversion on a part where the negative-electrode-side input loop line 22 and the negative-electrode-side output loop line 27 in FIG. 23 are magnetically coupled.

Equivalent inductors 16a, 16b, 16, 16d, 16e, and 16f are added as a result of the equivalent circuit conversion. Each of the equivalent inductors 16a, 16b, 16d, and 16e has inductance M/2, and each of the equivalent inductors 16c and 16f has inductance −M/2.

In the circuit obtained by performing the equivalent circuit conversion on the part where the positive-electrode-side input loop line 18 and the positive-electrode-side output loop line 26 are magnetically coupled, the equivalent inductors 16a and 16b having the mutual inductances M/2 generated by the magnetic coupling are connected in series between the positive-electrode-side input loop line 18 and the positive-electrode-side output loop line 26. Furthermore, in this circuit, the equivalent inductor 16c having a negative mutual inductance −M/2 is connected in series to the shunt path branched from the positive-electrode-side capacitor connection point 28.

In the circuit obtained by performing the equivalent circuit conversion on the part where the negative-electrode-side input loop line 22 and the negative-electrode-side output loop line 27 are magnetically coupled, the equivalent inductors 16d and 16e having mutual inductances M/2 generated by the magnetic coupling are connected in series between the negative-electrode-side input loop line 22 and the negative-electrode-side output loop line 27. Furthermore, in this circuit, the equivalent inductor 16f having a negative mutual inductance −M/2 is connected in series to the shunt path branched from the negative-electrode-side capacitor connection point 29. As a result, the shunt path between the positive-electrode-side capacitor connection point 28 and the negative-electrode-side capacitor connection point 29 has an inductance $L_{ESL}$−M.

In the noise filter circuit 1B, a part where the positive-electrode-side input loop line 18 and the positive-electrodeside output loop line 26 are magnetically coupled and a part where the negative-electrode-side input loop line 22 and the negative-electrode-side output loop line 27 are magnetically coupled are designed so that the inductance of the shunt path is 0, that is, $L_{ESL}$=M.

Consequently, the inductance $L_{ESL}$, which is originally held by the shunt path between the positive-electrode-side capacitor connection point 28 and the negative-electrode-side capacitor connection point 29, can be canceled and set to almost zero. As a result, deterioration of filter performance due to the influence of the ESL 11 can be suppressed.

In the noise filter circuit 1B, the positive-electrode-side input loop line 18 is disposed in a region inside the loop of the positive-electrode-side output loop line 26 on the front surface of the dielectric layer 2 as viewed in the thickness direction of the dielectric layer 2. Furthermore, the negative-electrode-side input loop line 22 is disposed in a region inside the loop of the negative-electrode-side output loop line 27 on the front surface of the dielectric layer 2 as viewed in the thickness direction of the dielectric layer 2.

With such configuration, in the noise filter circuit 1B, even in a case where interlayer misalignment occurs in the coupling loops, the area of the region where the positive-electrode-side input loop line 18 and the positive-electrode-side output loop line 26 overlap as viewed in the thickness direction of the dielectric layer 2 is not likely to be reduced. Furthermore, even in a case where interlayer misalignment occurs in the coupling loops, the area of the region where the negative-electrode-side input loop line 22 and the negative-electrode-side output loop line 27 overlap as viewed in the thickness direction of the dielectric layer 2 is not likely to be reduced.

Reduction in the mutual inductance M/2 is suppressed in such a way, and thus stable filter performance can be achieved.

Although an example in which the positive-electrode-side input loop line 18, the positive-electrode-side output loop line 26, the negative-electrode-side input loop line 22, and the negative-electrode-side output loop line 27 are configured in the arrangement in FIG. 22 is described above, the third embodiment is not limited to the configuration.

For example, the positive-electrode-side input loop line 18 may be disposed in a region outside the loop of the positive-electrode-side output loop line 26, and the negative-electrode-side input loop line 22 may be disposed in a region outside the loop of the negative-electrode-side output loop line 27, as viewed in the thickness direction of the dielectric layer 2.

Such configuration can also suppress the reduction of the mutual inductance M/2 due to the interlayer misalignment in the coupling loops.

The third embodiment may be configured to have still another configuration.

For example, in a positive-electrode-side path, the positive-electrode-side input loop line 18 may be disposed in a region inside the loop of the positive-electrode-side output loop line 26 as viewed in the thickness direction of the dielectric layer 2, and in a negative-electrode-side path, the negative-electrode-side input loop line 22 may be disposed in a region outside the loop of the negative-electrode-side output loop line 27 as viewed in the thickness direction of the dielectric layer 2.

Such configuration can also suppress the reduction of the mutual inductance due to the interlayer misalignment in the coupling loops.

In addition, in the positive-electrode-side path, the positive-electrode-side input loop line 18 may be disposed in a region outside the loop of the positive-electrode-side output loop line 26 as viewed in the thickness direction of the dielectric layer 2, and in the negative-electrode-side path, the negative-electrode-side input loop line 22 may be disposed in a region inside the loop of the negative-electrode-side output loop line 27 as viewed in the thickness direction of the dielectric layer 2.

Such configuration can also suppress the reduction of the mutual inductance due to the interlayer misalignment in the coupling loops.

Although in the above, some cases in which each of the positive-electrode-side input loop line 18, the positive-electrode-side output loop line 26, the negative-electrode-side input loop line 22, and the negative-electrode-side output loop line 27 has partially opened square loop shape are described, the third embodiment is not limited to such cases.

Figure 25:
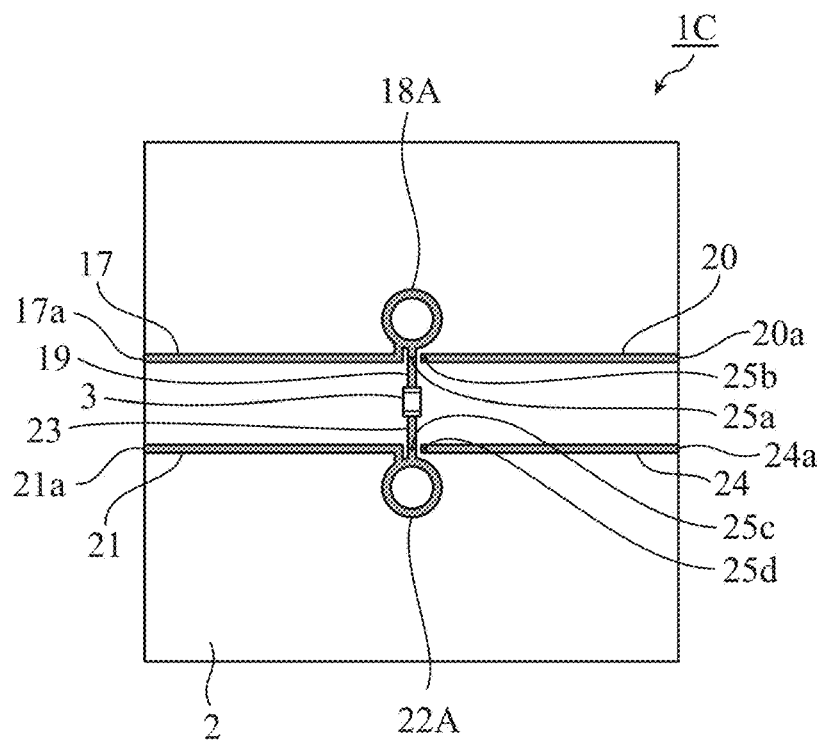
FIG. 25 is a plan view illustrating a variation of the noise filter circuit according to the third embodiment.
Figure 26:
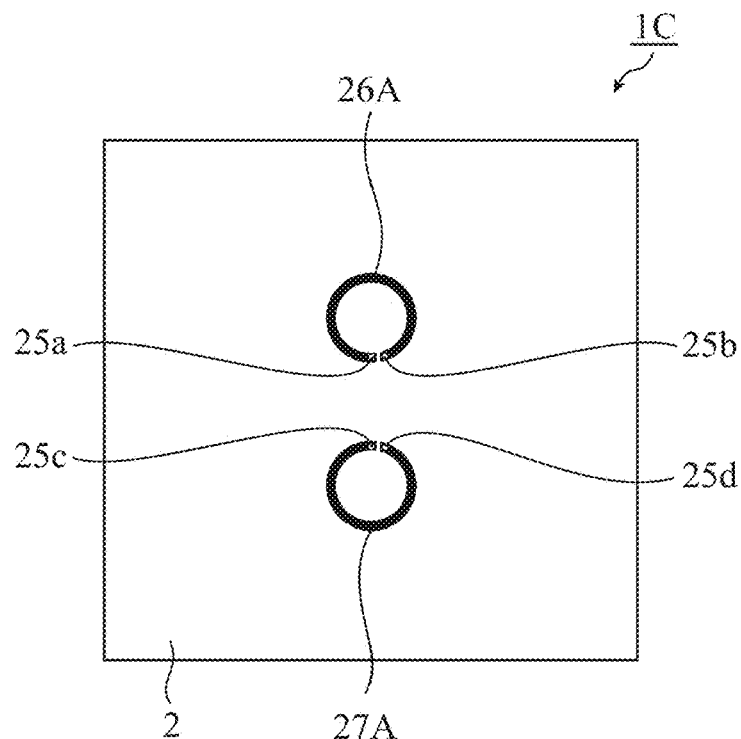
FIG. 26 is a transparent plan view illustrating a conductive pattern on the back side of the variation of the noise filter circuit according to the third embodiment.
Figure 27:
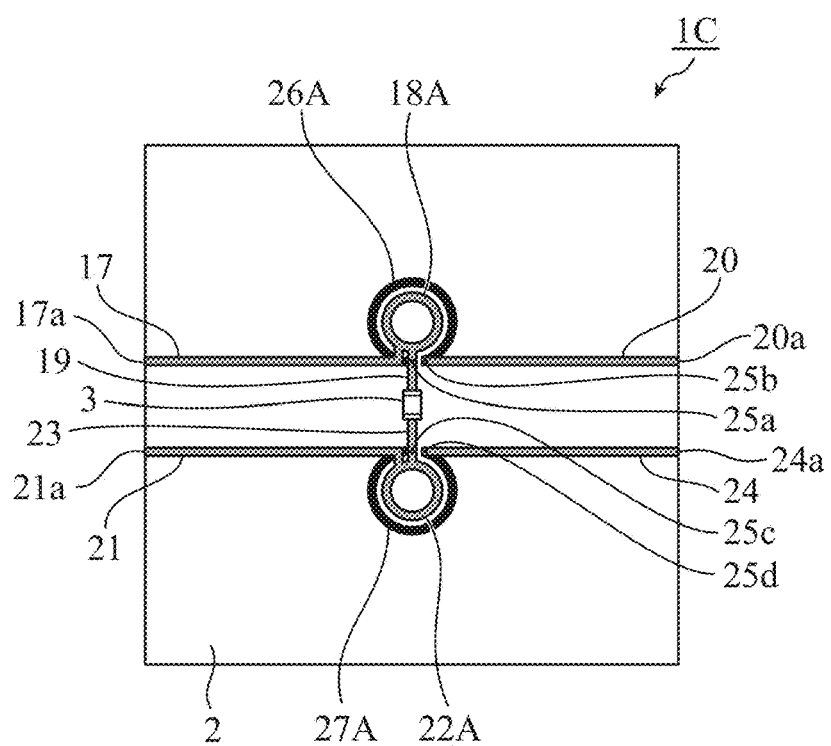
FIG. 27 is a transparent plan view illustrating the arrangement of the conductive pattern of the variation of the noise filter circuit according to the third embodiment.

FIG. 25 is a plan view illustrating a noise filter circuit 1C according to a variation of the third embodiment. FIG. 26 is a transparent plan view illustrating the conductive pattern on the back side of the noise filter circuit 1C, with components of the noise filter circuit 1C up to the conductive pattern on the back side being made transparent. FIG. 27 is a transparent plan view illustrating the arrangement of the conductive pattern of the noise filter circuit 1C in which a dielectric layer 2 is made transparent.

In the noise filter circuit 1C, the positive-electrode-side input loop line 18 and the positive-electrode-side output loop line 26 in the noise filter circuit 1B are replaced with a positive-electrode-side input loop line 18A and a positive-electrode-side output loop line 26A.

Furthermore, in the noise filter circuit 1C, the negative-electrode-side input loop line 22 and the negative-electrode-side output loop line 27 in the noise filter circuit 1B are replaced with a negative-electrode-side input loop line 22A and a negative-electrode-side output loop line 27A.

Each of the positive-electrode-side input loop line 18A and the positive-electrode-side output loop line 26A has a partially opened circular loop shape, and the positive-electrode-side input loop line 18A has a loop outer diameter smaller than the loop inner diameter of the positive-electrode-side output loop line 26A.

As illustrated in FIG. 27, the positive-electrode-side input loop line 18A is disposed in a region inside the loop of the positive-electrode-side output loop line 26A on the front surface of the dielectric layer 2 as viewed in the thickness direction of the dielectric layer 2.

Similarly, each of the negative-electrode-side input loop line 22A and the negative-electrode-side output loop line 27A has a partially opened circular loop shape, and the negative-electrode-side input loop line 22A has a loop outer diameter smaller than the loop inner diameter of the negative-electrode-side output loop line 27A.

In addition, the negative-electrode-side input loop line 22A has the same loop inner diameter as that of the positive-electrode-side input loop line 18A, and the negative-electrode-side output loop line 27A has the same loop outer diameter as that of the positive-electrode-side output loop line 26A.

As illustrated in FIG. 27, the negative-electrode-side input loop line 22A is disposed in a region inside the loop of the negative-electrode-side output loop line 27A on the front surface of the dielectric layer 2 as viewed in the thickness direction of the dielectric layer 2.

In the noise filter circuit 1C, even in a case where interlayer misalignment occurs in the coupling loops, the area of the region where the positive-electrode-side input loop line 18A and the positive-electrode-side output loop line 26A overlap as viewed in the thickness direction of the dielectric layer 2 is not likely to be reduced. Furthermore, the area of the region where the negative-electrode-side input loop line 22A and the negative-electrode-side output loop line 27A overlap as viewed in the thickness direction of the dielectric layer 2 is also not likely to be reduced.

Since reduction in the mutual inductance M/2 is suppressed in such a way, stable filter performance can be achieved.

Note that the third embodiment is not limited to the configurations in FIGS. 25 to 27.

For example, the positive-electrode-side input loop line 18A is formed to have a loop inner diameter larger than the loop outer diameter of the positive-electrode-side output loop line 26A, and the negative-electrode-side input loop line 22A is formed to have a loop inner diameter larger than the loop outer diameter of the negative-electrode-side output loop line 27A.

That is, the positive-electrode-side input loop line 18A may be disposed in a region outside the loop of the positive-electrode-side output loop line 26A as viewed in the thickness direction of the dielectric layer 2, and the negative-electrode-side input loop line 22A may be disposed in a region outside the loop of the negative-electrode-side output loop line 27A as viewed in the thickness direction of the dielectric layer 2.

Such configuration can also suppress the reduction of the mutual inductance due to the interlayer misalignment in the coupling loops.

In addition, the positive-electrode-side input loop line 18A may be disposed in a region inside the loop of the positive-electrode-side output loop line 26A as viewed in the thickness direction of the dielectric layer 2 in the positive-electrode-side path, and the negative-electrode-side input loop line 22A may be disposed in a region outside the loop of the negative-electrode-side output loop line 27A as viewed in the thickness direction of the dielectric layer 2 in the negative-electrode-side path.

Such configuration can also suppress the reduction of the mutual inductance due to the interlayer misalignment in the coupling loops.

Furthermore, the positive-electrode-side input loop line 18A may be disposed in a region outside the loop of the positive-electrode-side output loop line 26A as viewed in the thickness direction of the dielectric layer 2 in the positive-electrode-side path, and the negative-electrode-side input loop line 22A may be disposed in a region inside the loop of the negative-electrode-side output loop line 27A as viewed in the thickness direction of the dielectric layer 2 in the negative-electrode-side path.

Such configuration can also suppress the reduction of the mutual inductance due to the interlayer misalignment in the coupling loops.

As described above, in the noise filter circuit 1B according to the third embodiment, the positive-electrode-side input loop line 18 is disposed in a region inside or outside the loop of the positive-electrode-side output loop line 26 as viewed in the thickness direction of the dielectric layer 2, and the negative-electrode-side input loop line 22 is disposed in a region inside the loop of the negative-electrode-side output loop line 27 as viewed in the thickness direction of the dielectric layer 2.

Each of the positive-electrode-side input loop line 18, the positive-electrode-side output loop line 26, the negative-electrode-side input loop line 22, and the negative-electrode-side output loop line 27 has a partially opened rectangular loop shape.

Such configuration suppresses variation of the mutual inductance M/2 even in a case where interlayer misalignment occurs between the positive-electrode-side input loop line 18 and the positive-electrode-side output loop line 26.

Even in a case where interlayer misalignment occurs between the negative-electrode-side input loop line 22 and the negative-electrode-side output loop line 27, variation of the mutual inductance M/2 is also suppressed.

As a result, stable filter performance can be achieved.

Note that the effects similar to those described above can also be obtained in the noise filter circuit 1C.

Fourth Embodiment

Figure 28:
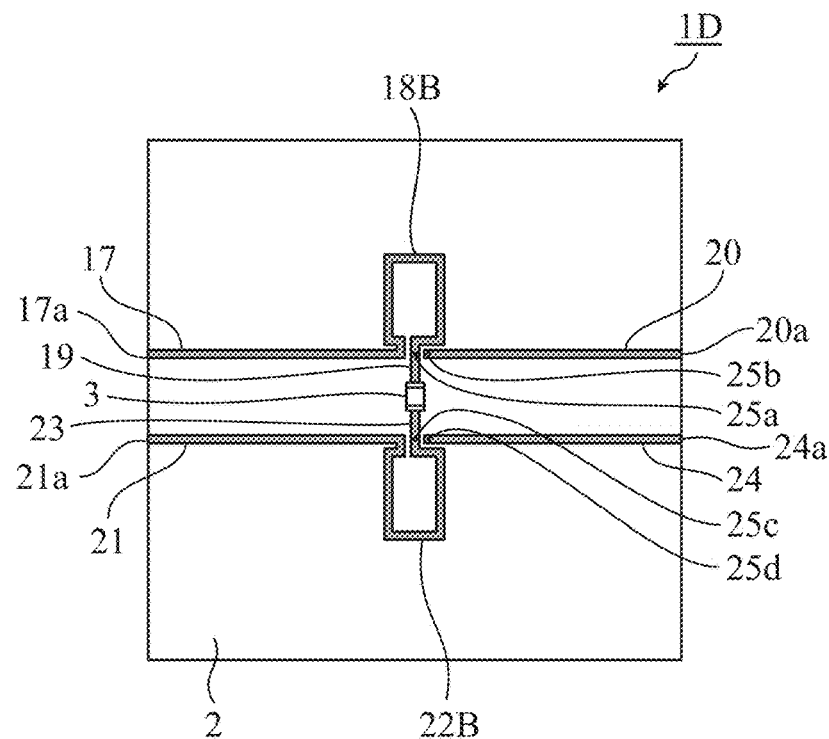
FIG. 28 is a plan view illustrating a noise filter circuit according to a fourth embodiment of the invention.
Figure 29:
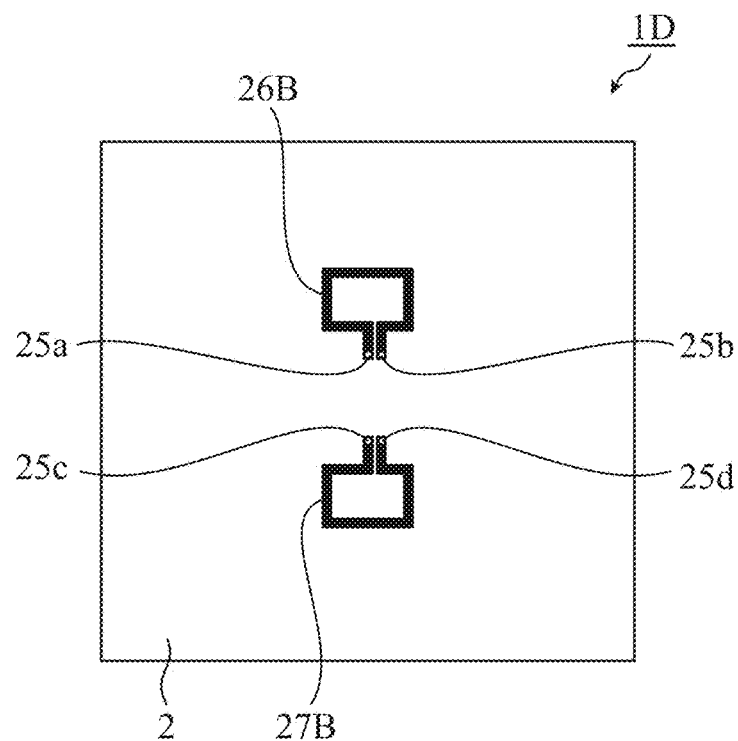
FIG. 29 is a transparent plan view illustrating a conductive pattern on the back side of the noise filter circuit according to the fourth embodiment.
Figure 30:
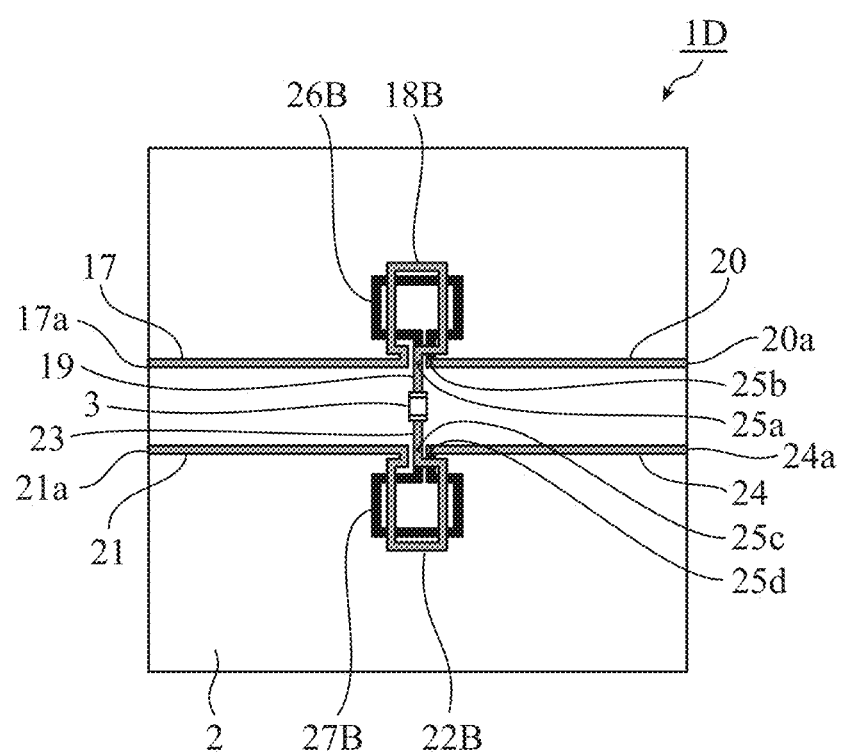
FIG. 30 is a transparent plan view illustrating the arrangement of the conductive pattern of the noise filter circuit according to the fourth embodiment.

FIG. 28 is a plan view illustrating a noise filter circuit 1D according to a fourth embodiment of the invention. FIG. 29 is a transparent plan view illustrating a conductive pattern on the back side of the noise filter circuit 1D, with components of the noise filter circuit 1D up to the conductive pattern on the back side being made transparent. FIG. 30 is a transparent plan view illustrating the arrangement of the conductive pattern of the noise filter circuit 1D, with a dielectric layer 2 being made transparent.

The noise filter circuit 1D has a substrate including a dielectric layer 2 and conductive patterns disposed on the front surface and back surface of the dielectric layer 2, and a chip capacitor 3 is mounted on the substrate.

A positive-electrode-side input line 17, a positive-electrode-side input loop line 18B, a positive-electrode-side capacitor connection line 19, and a positive-electrode-side output line 20 are formed on the front surface of the dielectric layer 2 by a conductive pattern. Furthermore, a negative-electrode-side input line 21, a negative-electrode-side input loop line 22B, a negative-electrode-side capacitor connection line 23, and a negative-electrode-side output line 24 are formed on the front surface of the dielectric layer 2 by a conductive pattern.

As illustrated in FIG. 28, the positive-electrode-side input line 17, the positive-electrode-side input loop line 18B, and the positive-electrode-side capacitor connection line 19 are connected in series in this order, and the negative-electrode-side input line 21, the negative-electrode-side input loop line 22B, and the negative-electrode-side capacitor connection line 23 are connected in series in this order.

As illustrated in FIGS. 29 and 30, a positive-electrode-side output loop line 26B and a negative-electrode-side output loop line 27B are formed on the back surface of the dielectric layer 2 by a conductive pattern.

As illustrated in FIG. 28, the positive-electrode-side input loop line 18B has a partially opened rectangular loop shape, and as illustrated in FIG. 29, the positive-electrode-side output loop line 26B has a partially opened rectangular loop shape.

Similarly, as illustrated in FIG. 28, the negative-electrode-side input loop line 22B has a partially opened rectangular loop shape, and as illustrated in FIG. 29, the negative-electrode-side output loop line 27B has a partially opened rectangular loop shape.

As illustrated in FIG. 30, the positive-electrode-side input loop line 18B and the positive-electrode-side output loop line 26B are disposed in such a manner that the long sides of the loop shape of the positive-electrode-side input loop line 18B are orthogonal to the long sides of the loop shape of the positive-electrode-side output loop line 26B as viewed in the thickness direction of the dielectric layer 2. Similarly, the negative-electrode-side input loop line 22B and the negative-electrode-side output loop line 27B are disposed in such a manner that the long sides of the loop shape of the negative-electrode-side input loop line 22B are orthogonal to the long sides of the loop shape of the negative-electrode-side output loop line 27B as viewed in the thickness direction of the dielectric layer 2.

Note that, in FIGS. 28 to 30, the same signs are attached to the same components as those in FIGS. 20 to 22, and description thereof will be omitted.

In the third embodiment, the equivalent circuit of the noise filter circuit 1D is the same as the circuits shown in FIGS. 23 and 24. In the noise filter circuit 1D, a part where the positive-electrode-side input loop line 18B and the positive-electrode-side output loop line 26B are magnetically coupled is designed, and a part where the negative-electrode-side input loop line 22B and the negative-electrode-side output loop line 27B are magnetically coupled is designed so that the inductance of the shunt path is 0.

By designing the magnetically coupled part in this way, the inductance of $L_{ESL}$, which is originally held by the shunt path between the positive-electrode-side capacitor connection point 28 and the negative-electrode-side capacitor connection point 29, can be canceled and set to almost zero. As a result, deterioration of filter performance due to the influence of the ESL 11 can be suppressed.

In addition, the positive-electrode-side input loop line 18B is arranged to be a state obtained by rotating the positive-electrode-side output loop line 26B by 90 degrees on the front surface of the dielectric layer 2 as viewed in the thickness direction of the dielectric layer 2.

Similarly, the negative-electrode-side input loop line 22B is arranged to be a state obtained by rotating the negative-electrode-side output loop line 27B by 90 degrees on the front surface of the dielectric layer 2 as viewed in the thickness direction of the dielectric layer 2.

With such configuration, in the noise filter circuit 1D, even in a case where interlayer misalignment occurs in the coupling loops, the area of the region where the positive-electrode-side input loop line 18B and the positive-electrode-side output loop line 26B overlap as viewed in the thickness direction of the dielectric layer 2 is not likely to be reduced.

Similarly, in the noise filter circuit 1D, even in a case where interlayer misalignment occurs in the coupling loops, the area of the region where the negative-electrode-side input loop line 22B and the negative-electrode-side output loop line 27B overlap as viewed in the thickness direction of the dielectric layer 2 is not likely to be reduced.

As a result, reduction in the mutual inductance due to interlayer misalignment in coupling loops is suppressed, so that stable filter performance can be achieved.

As described above, in the noise filter circuit 1D according to the fourth embodiment, the positive-electrode-side input loop line 18B and the positive-electrode-side output loop line 26B are disposed in such a manner that the long sides of the loop shape of the positive-electrode-side input loop line 18B and the long sides of the loop shape of the positive-electrode-side output loop line 26B are orthogonal to each other as viewed in the thickness direction of the dielectric layer 2. Similarly, the negative-electrode-side input loop line 22B and the negative-electrode-side output loop line 27B are disposed in such a manner that the long sides of the loop shape of the negative-electrode-side input loop line 22B and the long sides of the loop shape of the negative-electrode-side output loop line 27B are orthogonal to each other as viewed in the thickness direction of the dielectric layer 2.

According to such a configuration, even in a case where interlayer misalignment occurs between the positive-electrode-side input loop line 18B and the positive-electrode-side output loop line 26B, variation of the mutual inductance is suppressed, so that stable filter performance can be achieved. Furthermore, even in a case where interlayer misalignment occurs between the negative-electrode-side input loop line 22B and the negative-electrode-side output loop line 27B, variation of the mutual inductance is suppressed, so that stable filter performance can be achieved.

In addition, as described below, a configuration obtained by combining the configuration in the third embodiment and that in the fourth embodiment may be adopted as a modified embodiment. Even in the configurations as described below, variation of the mutual inductance in coupling loops due to interlayer misalignment between the coupling loops is suppressed, and stable filter performance can be achieved.

For example, each of the positive-electrode-side input loop line 18 and the positive-electrode-side output loop line 26 is configured to have a partially opened rectangular loop shape or a partially opened circular loop shape, and each of the negative-electrode-side input loop line 22 and the negative-electrode-side output loop line 27 is configured to have a partially opened rectangular loop shape.

In the positive-electrode-side path, the positive-electrode-side input loop line 18 may be disposed in a region inside the loop of the positive-electrode-side output loop line 26 as viewed in the thickness direction of the dielectric layer 2, and in the negative-electrode-side path, the negative-electrode-side input loop line 22B and the negative-electrode-side output loop line 27B may be disposed in such a manner that long sides of the loop shape of the negative-electrode-side input loop line 22B and the long sides of the loop shape of the negative-electrode-side output loop line 27B are orthogonal to each other as viewed in the thickness direction of the dielectric layer 2.

For example, each of the positive-electrode-side input loop line 18 and the positive-electrode-side output loop line 26 is configured to have a partially opened rectangular loop shape or a partially opened circular loop shape, and each of the negative-electrode-side input loop line 22 and the negative-electrode-side output loop line 27 is configured to have a partially opened rectangular loop shape.

In the positive-electrode-side path, the positive-electrode-side input loop line 18 may be disposed in a region outside the loop of the positive-electrode-side output loop line 26 as viewed in the thickness direction of the dielectric layer 2, and in the negative-electrode-side path, the negative-electrode-side input loop line 22B and the negative-electrode-side output loop line 27B may be disposed in such a manner that the long sides of the loop shape of the negative-electrode-side input loop line 22B and the long sides of the loop shape of the negative-electrode-side output loop line 27B are orthogonal to each other as viewed in the thickness direction of the dielectric layer 2.

For example, each of the positive-electrode-side input loop line 18 and the positive-electrode-side output loop line 26 is configured to have a partially opened rectangular loop shape, and each of the negative-electrode-side input loop line 22 and the negative-electrode-side output loop line 27 is configured to have a partially opened rectangular loop shape or a partially opened circular loop shape.

In the positive-electrode-side path, the positive-electrode-side input loop line 18 and the positive-electrode-side output loop line 26 may be disposed in such a manner that the long sides of the loop shape of the positive-electrode-side input loop line 18 and the long sides of the loop shape of the positive-electrode-side output loop line 26 are orthogonal to each other as viewed in the thickness direction of the dielectric layer 2, and in the negative-electrode-side path, the negative-electrode-side input loop line 22 may be disposed in a region inside the loop of the negative-electrode-side output loop line 27 as viewed in the thickness direction of the dielectric layer 2.

For example, each of the positive-electrode-side input loop line 18 and the positive-electrode-side output loop line 26 has a partially opened rectangular loop shape, and each of the negative-electrode-side input loop line 22 and the negative-electrode-side output loop line 27 has a partially opened rectangular loop shape or a partially opened circular loop shape.

In the positive-electrode-side path, the positive-electrode-side input loop line 18 and the positive-electrode-side output loop line 26 may be disposed in such a manner that the long sides of the loop shape of the positive-electrode-side input loop line 18 and the long sides of the loop shape of the positive-electrode-side output loop line 26 are orthogonal to each other as viewed in the thickness direction of the dielectric layer 2, and in the negative-electrode-side path, the negative-electrode-side input loop line 22 may be disposed in a region outside the loop of the negative-electrode-side output loop line 27 as viewed in the thickness direction of the dielectric layer 2.

Note that the invention is not limited to the above-described embodiments, the embodiments can be freely combined, any component in each of the embodiments can be modified, and any component in each of the embodiments can be omitted within the scope of the invention.

INDUSTRIAL APPLICABILITY

According to the noise filter circuit of the invention, variation of a mutual inductance due to interlayer misalignment in coupling loops is suppressed, so that stable filter performance can be achieved, and thus the noise filter circuit can be used in various wireless communication devices.

REFERENCE SIGNS LIST

1, 1A to 1D: noise filter circuit, 2: dielectric layer, 3: capacitor, 4: input line, 4a: input terminal, 5, 5', 5A: input loop line, 6: capacitor connection line, 7: output line, 7a: output terminal, 8a to 8c, 25a to 25d: through hole, 9, 9', 9A: output loop line, 10: ground conductor, 13: capacitance, 14: ground, 15: capacitor connection point, 16a to 16f: equivalent inductor, 17: positive-electrode-side input line, 17a: positive-electrode-side input terminal, 18, 18A, 18B: positive-electrode-side input loop line, 19: positive-electrode-side capacitor connection line, 20: positive-electrode-side output line, 20a: positive-electrode-side output terminal, 21: negative-electrode-side input line, 21a: negative-electrode-side input terminal, 22, 22A, 22B: negative-electrode-side input loop line, 23: negative-electrode-side capacitor connection line, 24: negative-electrode-side output line, 24a: negative-electrode-side output terminal, 26, 26A, 26B: positive-electrode-side output loop line, 27, 27A, 27B: negative-electrode-side output loop line, 28: positive-electrode-side capacitor connection point, 29: negative-electrode-side capacitor connection point.

The invention claimed is:

1. A noise filter circuit comprising:
a dielectric layer having one side on which an input line, an input loop line, a capacitor connection line, and an output line are formed, the input line, the input loop line, and the capacitor connection line being connected in series in this order, and having another side on which an output loop line connected between the capacitor connection line and the output line and a ground conductor surrounding the output loop line are formed, the capacitor connection line being branched from a route formed by the input loop line and the output loop line at a node at which the input loop line and the output loop line are connected; and
a capacitor having one end connected to the capacitor connection line and another end connected to the ground conductor,
wherein a winding direction of the input loop line from the input line to the capacitor connection line is same as a winding direction of the output loop line from the capacitor connection line to the output line, and
the input loop line is disposed in a region inside or outside the output loop line as viewed in a thickness direction of the dielectric layer.

2. The noise filter circuit according to claim 1,
wherein each of the input loop line and the output loop line has a partially opened rectangular loop shape.

3. The noise filter circuit according to claim 1,
wherein each of the input loop line and the output loop line has a partially opened circular loop shape.

4. The noise filter circuit according to claim 1, wherein the input loop line is disposed in the region inside or outside the output loop line as viewed in the thickness direction of the dielectric layer, so that a mutual inductance between the input loop line and output loop line is suppressed in a case of misalignment between the input loop line and output loop line.

5. A noise filter circuit comprising:
a dielectric layer having one side on which a positive-electrode-side input line, a positive-electrode-side input loop line, a positive-electrode-side capacitor connection line, a positive-electrode-side output line, a negative-electrode-side input line, a negative-electrode-side input loop line, a negative-electrode-side capacitor connection line, and a negative-electrode-side output line are formed, the positive-electrode-side input line, the positive-electrode-side input loop line, and the positive-electrode-side capacitor connection line being connected in series in this order, the negative-electrode-side input line, the negative-electrode-side input loop line, and the negative-electrode-side capacitor connection line being connected in series in this order, and having another side on which a positive-electrode-side output loop line connected between the positive-electrode-side capacitor connection line and the positive-electrode-side output line and a negative-electrode-side output loop line connected between the negative-electrode-side capacitor connection line and the negative-electrode-side output line are formed, the positive-electrode-side capacitor connection line being branched from a route formed by the positive-electrode-side input loop line and the positive-electrode-side output loop line at a node at which the positive-electrode-side input loop line and the positive-electrode-side output loop line are connected, and the negative-electrode-side capacitor connection line being branched from a route formed by the negative-electrode-side input loop line and the negative-electrode-side output loop line at a node at which the negative-electrode-side input loop line and the negative-electrode-side output loop line are connected; and a capacitor having one end connected to the positive-electrode-side capacitor connection line and another end connected to the negative-electrode-side capacitor connection line, wherein a winding direction of the positive-electrode-side input loop line from the positive-electrode-side input line to the positive-electrode-side capacitor connection line is same as a winding direction of the positive-electrode-side output loop line from the positive-electrode-side capacitor connection line to the positive-electrode-side output line, a winding direction of the negative-electrode-side input loop line from the negative-electrode-side input line to the negative-electrode-side capacitor connection line is same as a winding direction of the negative-electrode-side output loop line from the negative-electrode-side capacitor connection line to the negative-electrode-side output line, the positive-electrode-side input loop line is disposed in a region inside or outside of the positive-electrode-side output loop line as viewed in a thickness direction of the dielectric layer, and the negative-electrode-side input loop line is disposed in a position inside or outside of the negative-electrode-side output loop line as viewed in the thickness direction of the dielectric layer.

6. The noise filter circuit according to claim 5,
wherein each of the positive-electrode-side input loop line, the positive-electrode-side output loop line, the negative-electrode-side input loop line, and the negative-electrode-side output loop line has a partially opened rectangular loop shape.

7. The noise filter circuit according to claim 5,
wherein each of the positive-electrode-side input loop line, the positive-electrode-side output loop line, the negative-electrode-side input loop line, and the negative-electrode-side output loop line has a partially opened circular loop shape.

8. A noise filter circuit comprising:
a dielectric layer having one side on which a positive-electrode-side input line, a positive-electrode-side input loop line, a positive-electrode-side capacitor connection line, a positive-electrode-side output line, a negative-electrode-side input line, a negative-electrode-side input loop line, a negative-electrode-side capacitor connection line, and a negative-electrode-side output line are formed, the positive-electrode-side input line, the positive-electrode-side input loop line, and the positive-electrode-side capacitor connection line being connected in series in this order, the negative-electrode-side input line, the negative-electrode-side input loop line, and the negative-electrode-side capacitor connection line being connected in series in this order, and having another side on which a positive-electrode-side output loop line connected between the positive-electrode-side capacitor connection line and the positive-electrode-side output line and a negative-electrode-side output loop line connected between the negative-electrode-side capacitor connection line and the negative-electrode-side output line are formed, the positive-electrode-side capacitor connection line being branched from a route formed by the positive-electrode-side input loop line and the positive-electrode-side output loop line at a node at which the positive-electrode-side input loop line and the positive-electrode-side output loop line are connected, and the negative-electrode-side capacitor connection line being branched from a route formed by the negative-electrode-side input loop line and the negative-electrode-side output loop line at a node at which the negative-electrode-side input loop line and the negative-electrode-side output loop line are connected; and a capacitor having one end connected to the positive-electrode-side capacitor connection line and another end connected to the negative-electrode-side capacitor connection line, wherein a winding direction of the positive-electrode-side input loop line from the positive-electrode-side input line to the positive-electrode-side capacitor connection line is same as a winding direction of the positive-electrode-side output loop line from the positive-electrode-side capacitor connection line to the positive-electrode-side output line, a winding direction of the negative-electrode-side input loop line from the negative-electrode-side input line to the negative-electrode-side capacitor connection line is same as a winding direction of the negative-electrode-side output loop line from the negative-electrode-side capacitor connection line to the negative-electrode-side output line, each of the positive-electrode-side input loop line and the positive-electrode-side output loop line has a partially opened rectangular loop shape, and a long side of the positive-electrode-side input loop line and a long side of the positive-electrode-side output loop line are orthogonal to each other as viewed in a thickness direction of the dielectric layer, and each of the negative-electrode-side input loop line and the negative-electrode-side output loop line has a partially opened rectangular loop shape, and a long side of the negative-electrode-side input loop line and a long side of the negative-electrode-side output loop line are orthogonal to each other as viewed in a thickness direction of the dielectric layer.

9. A noise filter circuit comprising:
a dielectric layer having one side on which an input line, an input loop line, a capacitor connection line, and an output line are formed, the input line, the input loop line, and the capacitor connection line being connected in series in this order, and having another side on which an output loop line connected between the capacitor connection line and the output line and a ground conductor surrounding the output loop line are formed, the capacitor connection line being branched from a route formed by the input loop line and the output loop line at a node at which the input loop line and the output loop line are connected; and a capacitor having one end connected to the capacitor connection line and another end connected to the ground conductor, wherein a winding direction of the input loop line from the input line to the capacitor connection line is same as a winding direction of the output loop line from the capacitor connection line to the output line, and each of the input loop line and the output loop line has a partially opened rectangular loop shape, and a long side of the input loop line and a long side of the output loop line are orthogonal to each other as viewed in a thickness direction of the dielectric layer.

* * * * *